United States Patent
Sun et al.

(10) Patent No.: US 11,268,859 B2
(45) Date of Patent: *Mar. 8, 2022

(54) WEARABLE INFRARED TEMPERATURE SENSING DEVICE

(71) Applicant: PIXART IMAGING INC., Hsin-Chu (TW)

(72) Inventors: Chih-Ming Sun, Hsin-Chu (TW); Ming-Han Tsai, Hsin-Chu (TW); Cheng-Nan Tsai, Hsin-Chu (TW)

(73) Assignee: PIXART IMAGING INC., Hsin-Chu (TW)

( * ) Notice: Subject to any disclaimer, the term of this patent is extended or adjusted under 35 U.S.C. 154(b) by 21 days.

This patent is subject to a terminal disclaimer.

(21) Appl. No.: 16/850,187

(22) Filed: Apr. 16, 2020

(65) Prior Publication Data

US 2020/0240846 A1 Jul. 30, 2020

Related U.S. Application Data

(63) Continuation of application No. 16/194,212, filed on Nov. 16, 2018, now Pat. No. 10,670,465, which is a
(Continued)

(30) Foreign Application Priority Data

Mar. 20, 2015 (TW) .................................. 104108897
Mar. 16, 2016 (TW) .................................. 105108127

(51) Int. Cl.
*G01J 5/02* (2006.01)
*G01J 5/04* (2006.01)
(Continued)

(52) U.S. Cl.
CPC .......... *G01J 5/0265* (2013.01); *B81B 7/0064* (2013.01); *B81B 7/0067* (2013.01); *G01J 5/041* (2013.01);
(Continued)

(58) Field of Classification Search
CPC ........... G01K 13/00; G01K 1/08; G01K 7/16; G01K 13/02; G01K 1/14; G01K 7/36; G01K 7/42; G01K 11/00; G01K 15/005; G01K 7/00; G01K 7/01; G01K 7/02; G01K 11/32; G01K 1/024; G01K 1/026; G01K 1/143; G01K 3/005; G01K 7/22;
(Continued)

(56) References Cited

FOREIGN PATENT DOCUMENTS

| CN | 102881704 A | 1/2013 |
|----|-------------|--------|
| CN | 204618221 U | 9/2015 |

*Primary Examiner* — Andre J Allen
(74) *Attorney, Agent, or Firm* — Li & Cai Intellectual Property (USA) Office

(57) ABSTRACT

A wearable device includes a case and a far infrared temperature sensing device. The case has a first opening. The far infrared temperature sensing device is disposed inside the case of the wearable device. The far infrared temperature sensing device includes an assembly structure, a sensor chip, a filter structure, and a metal shielding structure. The assembly structure has an accommodating space and a top opening. The sensor chip is disposed in the accommodating space of the assembly structure. The filter structure is disposed above the sensor chip. The metal shielding structure is disposed above the sensor chip, and has a second opening to expose the filter structure. The first and second openings are communicated to cooperatively define a through hole.

9 Claims, 11 Drawing Sheets

Related U.S. Application Data continuation of application No. 15/172,983, filed on Jun. 3, 2016, now Pat. No. 10,168,220, which is a continuation-in-part of application No. 14/726,472, filed on May 30, 2015, now Pat. No. 10,168,219.

(51) Int. Cl.

| | | |
|---|---|---|
| *H04N 5/33* | (2006.01) | |
| *G01J 5/06* | (2022.01) | |
| *H04N 5/225* | (2006.01) | |
| *B81B 7/00* | (2006.01) | |

(52) U.S. Cl.
CPC ............... *G01J 5/045* (2013.01); *G01J 5/06* (2013.01); *H04N 5/2257* (2013.01); *H04N 5/33* (2013.01); *B81B 2201/0278* (2013.01)

(58) Field of Classification Search
CPC .. G01K 11/125; G01K 1/20; G01K 2013/024; G01K 2205/00; G01K 7/32; G01K 11/06; G01K 11/20; G01K 11/26; G01K 11/3206; G01K 13/002; G01K 15/007; G01K 1/10; G01K 2013/026; G01K 7/023; G01K 7/13; G01K 7/18; G01K 7/40; G01K 7/427; G01K 11/006; G01K 11/12; G01K 11/16; G01K 11/165; G01K 11/18; G01K 13/08; G01K 15/00; G01K 17/08; G01K 1/02; G01K 1/16; G01K 2007/163; G01K 2007/422; G01K 2205/02; G01K 2205/04; G01K 2207/00; G01K 2207/06; G01K 2207/08; G01K 2217/00; G01K 3/04; G01K 3/10; G01K 5/46; G01K 7/021; G01K 7/028; G01K 7/06; G01K 7/08; G01K 7/12; G01K 7/203; G01K 7/223; G01K 7/34; G01K 7/38; G01J 5/025; G01J 5/0859; G01J 2005/0085; G01J 2005/202; G01J 3/427; G01J 3/4338; G01J 5/0011; G01J 5/0014; G01J 5/0037; G01J 5/0088; G01J 5/021; G01J 5/023; G01J 5/024; G01J 5/0265; G01J 5/027; G01J 5/028; G01J 5/04; G01J 5/045; G01J 5/046; G01J 5/048; G01J 5/061; G01J 5/0803; G01J 5/0812; G01J 5/0853; G01J 5/0896; G01J 5/10; G01J 5/12; G01J 5/16; G01J 5/20; G01J 5/601; B81B 2201/0278; B81B 2201/0257; B81B 2207/012; B81B 7/0087
USPC ................................... 374/1–210
See application file for complete search history.

WEARABLE INFRARED TEMPERATURE SENSING DEVICE

CROSS REFERENCE TO RELATED APPLICATION

This is a continuation application of Ser. No. 16/194,212 filed on Nov. 16, 2018 and entitled "WEARABLE INFRARED TEMPERATURE SENSING DEVICE", which is a continuation application of U.S. application Ser. No. 15/172,983, filed on Jun. 3, 2016, which is a continuation-in-part application of U.S. application Ser. No. 14/726,472, filed on 30 May 2015, where all of the aforementioned patent applications and patents are incorporated herein by reference.

BACKGROUND OF THE INVENTION

1. Field of the Invention

The instant disclosure relates to a wearable device; in particular, to a wearable infrared temperature sensing device.

2. Description of Related Art

Using exercise to maintain health has become increasingly popular, and the development of related products for self-monitoring of physiological status are more important, such as wearable or handheld consumer electronic products, for example, fitness bracelets, smartwatches, and smartphones. These products include biomarkers for measuring heart beats, blood pressure, blood sugar, or blood oxygen levels, or for monitoring sleep quality. Smartwatches are the most popular wearable electronic products.

The infrared sensors can be divided into thermal infrared sensors and quantum type infrared sensors, and thermal infrared sensors include thermocouple, thermopile, resistive thermal radiation, and pyroelectric sensor. The thermopile is an optical element for detecting temperature. The theory is that, when a temperature difference occurs on both sides of the thermopile, it will produce electricity, and the temperature difference and electric energy are converted to each other. The technology of thermopile is widely used in temperature detection. It also widely used in medical temperature detection, such as the infrared thermometer applied on the ear thermometer and the forehead thermometer. Nowadays, there are many products developed dedicated to applying the medical thermopile infrared temperature sensing technology on the abovementioned wearable electronic products disposing the infrared temperature sensor in the smartwatch, so as to detect the user's body temperature or the ambient temperature.

However, the smartwatch, having various measuring functions, in addition to the infrared temperature sensor, might have various sensors like heartbeat, blood pressure, blood sugar, and blood oxygen levels that are disposed in the same space simultaneously. Furthermore there are external electronic signals, such that the internal and external signals interfere with each other, so as to decrease the detection accuracy. Therefore, solving the problem of noise signals generated among the various sensors and the external electronic products is one of the important issues in the art.

SUMMARY OF THE INVENTION

The instant disclosure addresses the technical problem of providing a wearable device which includes a far infrared temperature sensing device containing a metal shielding structure to block the noise generated from other sensors and external electronic products, and to block other far infrared from passing into the case of the wearable device avoiding interference with the sensing device, so as to increase the detection accuracy on the far infrared temperature.

To address the abovementioned technical problem, one of the embodiments of this instant disclosure provides a wearable device including a case and a far infrared temperature sensing device. The case has a first opening. The far infrared temperature sensing device is disposed inside the case of the wearable device. The far infrared temperature sensing device includes an assembly structure, a sensor chip, a filter structure, and a metal shielding structure. The assembly structure has an accommodating space and a top opening. The sensor chip is disposed in the accommodating space of the assembly structure. The filter structure is disposed above the sensor chip. The metal shielding structure is disposed above the sensor chip, and has a second opening to expose the filter structure. The first and second openings are communicated to cooperatively define a through hole.

Another embodiment of this instant disclosure provides a wearable device including a case and a far infrared temperature sensing device. The case has a first opening. The far infrared temperature sensing device is disposed inside the case of the wearable device, and the far infrared temperature sensing device includes a circuit substrate, an assembly structure, a sensor chip, and a filter structure. The circuit substrate is disposed in the case, contains a metal shielding structure, and has a second opening. The assembly structure is disposed below the circuit substrate, and has an accommodating space and a top opening. The sensor chip is disposed in the accommodating space of the assembly structure. The filter structure is disposed at the top opening of the assembly structure and is located above the sensor chip to enclose the accommodating space of the assembly structure. The first and second openings are communicated to cooperatively define a through hole.

Yet another embodiment of this instant disclosure provides a wearable device including a case and a far infrared temperature sensing device. The case has a first opening. The far infrared temperature sensing device is disposed inside the case of the wearable device, and the far infrared temperature sensing device includes a circuit substrate, a sensor chip, a filter structure, and a metal shielding structure. The circuit substrate is disposed in the case. The sensor chip is disposed on the circuit substrate. The filter structure is disposed on the sensor chip. The metal shielding structure is disposed in the case and located above the filter structure, and has a second opening to expose the filter structure. The first and second openings are communicated to cooperatively define a through hole.

Yet another embodiment of this instant disclosure provides a wearable device including a case and a far infrared temperature sensing device. The case has a first opening. The far infrared temperature sensing device is disposed inside the case of the wearable device, and the far infrared temperature sensing device includes an assembly structure, a sensor chip, a filter structure, and a metal shielding structure. The sensor chip is disposed on the assembly structure. The filter structure is disposed above the sensor chip. The metal shielding structure is disposed on the assembly structure, surrounds the assembly structure and the filter structure, and has a second opening to expose the filter structure.

This instant disclosure has the benefit that the metal shielding structure surrounding the internal sensing elements (e.g., sensor chip, circuit substrate) in the far infrared temperature sensing device of the wearable device can block the noise generated from other sensors and external electronic products that can interfere with the sensing elements, and blocks other far infrared from passing into the case of the wearable device avoiding the sensing result of the sensor chip from being affected, so as to increase the detection accuracy on the far infrared temperature. The metal shielding structure further has an opening, which only allows the infrared at a certain position to enter, and other parts outside the opening are blocked by the metal shielding structure and cannot enter into the wearable device. In this way, it can have a superior Signal-to-Noise Ratio (SNR). Meanwhile, the detection accuracy on the far infrared temperature can be increased.

In order to further appreciate the characteristics and technical contents of the present invention, references are hereunder made to the detailed descriptions and appended drawings in connection with the instant disclosure. However, the appended drawings are merely shown for exemplary purposes, rather than being used to restrict the scope of the instant disclosure.

DETAILED DESCRIPTION OF THE PREFERRED EMBODIMENTS

Embodiments of wearable device disclosed in the instant disclosure are illustrated via specific examples as follows, and people familiar in the art may easily understand the advantages and efficacies of the instant disclosure by disclosure of the specification. The instant disclosure may be implemented or applied by other different specific examples, and each of the details in the specification may be applied based on different views and may be modified and changed under the existence of the spirit of the instant disclosure. The figures in the instant disclosure are only for brief description, but they are not depicted according to actual size and do not reflect the actual size of the relevant structure. The following embodiments further illustrate related technologies of the instant disclosure in detail, but the scope of the instant disclosure is not limited herein.

First Embodiment

Figure 1:
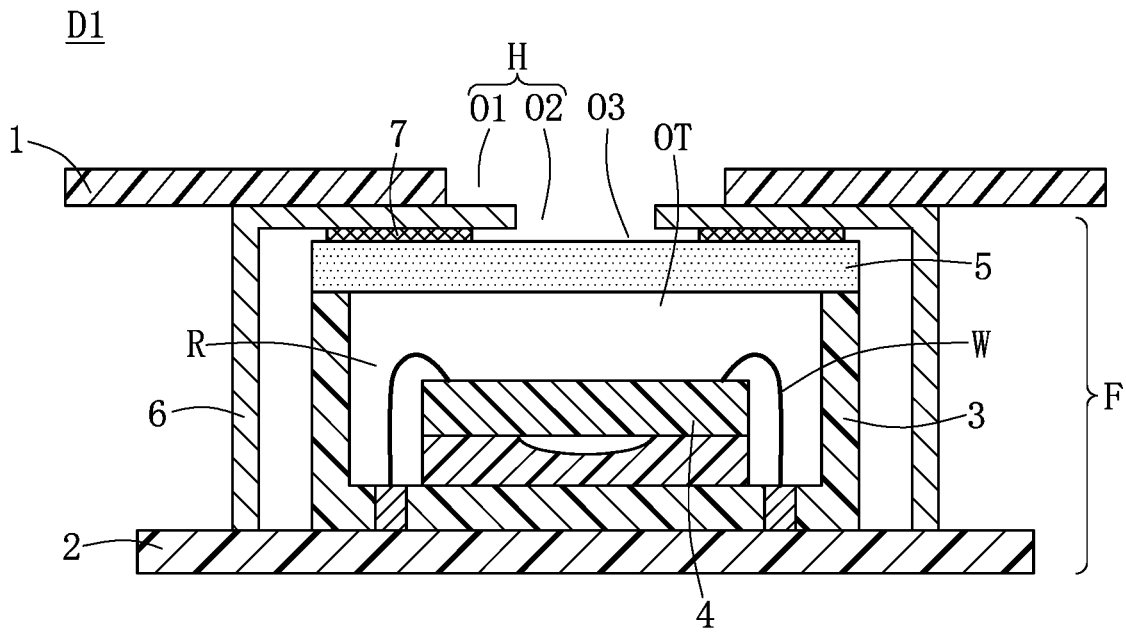
FIG. 1 shows a schematic view of a wearable device of a first embodiment in the instant disclosure.

Please refer to FIG. 1. FIG. 1 shows a schematic view of a wearable device D1 of a first embodiment in the instant disclosure. The first embodiment of this instant disclosure provides a wearable device D1 which includes a case 1 and a far infrared temperature sensing device F. The case 1 has a first opening O1. The far infrared temperature sensing device F is disposed inside the case 1 of the wearable device D1, and includes a circuit substrate 2, an assembly structure 3, a sensor chip 4, a filter structure 5, a metal shielding structure 6, and a waterproof structure 7. The circuit substrate 2 is disposed in the case 1. The assembly structure 3 is disposed on the circuit substrate 2, and has an accommodating space R and a top opening OT. The sensor chip 4 is disposed in the accommodating space R of the assembly structure 3, and is electrically connected to the assembly structure 3 by at least one wire W (wire bonding). The filter structure 5 is disposed above the sensor chip 4, and at the top opening OT of the assembly structure 3 to enclose the accommodating space R of the assembly structure 3. The metal shielding structure 6 is disposed on the circuit substrate 2, and has a second opening O2 to expose the filter structure 5. The waterproof structure 7 is surroundingly disposed in the metal shielding structure 6 and located above the filter structure 5, and has a has a third opening O3 to expose the filter structure 5. The first opening O1 and the second opening O2 are communicated to cooperatively define a through hole H, and the third opening O3 and the through hole H are communicated with each other.

Specifically, the case 1 can be a watch case of a smartwatch. The circuit substrate 2 can be a Printed Circuit Board (PCB). The assembly structure 3 can be a Surface-Mount Devices (SMD) substrate or a Ceramic Leadless Chip Carrier (CLCC) substrate. The sensor chip 4 is a far infrared sensor chip, and the complementary metal oxide semiconductor micro-electromechanical systems (CMOS MEMS) process can be used in the sensor chip 4.

In particular, the sensor chip 4 is mainly used to detect the Far Infrared (FIR) which has a wavelength ranging from 15 to 1000 μm. Since living organisms feel heat approximately in this wave band at room temperature, the sensor chip 4 is used to detect the temperature of the thermal radiation generated from the far infrared in this embodiment.

Moreover, the filter structure 5 can be a far infrared filter which can allow the far infrared to pass through. In this embodiment, the metal shielding structure 6 in addition can be used to block the noise generated from other sensors and external electronic products, and it further can prevent other far infrared from passing through into the case 1 of the wearable device D1 to affect the sensing results of the sensor chip 4 and to decrease the temperature detection accuracy. Particularly, the material of the metal shielding structure 6 is selected from the group consisting of silver, copper, aluminum, iron, and other materials which can block the noise, but the material of the metal shielding structure 6 is not limited in this instant disclosure. In addition, the waterproof structure 7 can be a waterproof glue or a waterproof layer that can prevent moisture entering into the wearable device D1 of this instant disclosure to cause corrosion and rusting of the element, and also can prevent the particles in the air entering into the wearable device D1 of this instant disclosure to avoid the element suffering from abrasion by particles in the air, so as to lengthen the lifetime of the product. The material of the waterproof structure 7 is selected from a group consisting of silica gel, polyurethane (PU), and epoxy resin.

In the first embodiment of this instant disclosure, the case 1 has the first opening O1, the metal shielding structure 6 has the second opening O2, the waterproof structure 7 has the third opening O3, the main reason being that, when the user wears the wearable device D1 of this instant disclosure (e.g., smartwatch), the thermal radiation generated from the body that is in the far infrared which can pass through these openings (through hole H and third opening O3) to enter into the far infrared temperature sensing device F of the wearable device D1, the filter structure 5 can filter out other visible light and only allow the far infrared to pass through the filter structure 5 and enter into the accommodating space R, and the sensor chip 4 receives the far infrared to further conduct the temperature detection.

Second Embodiment

Figure 2:
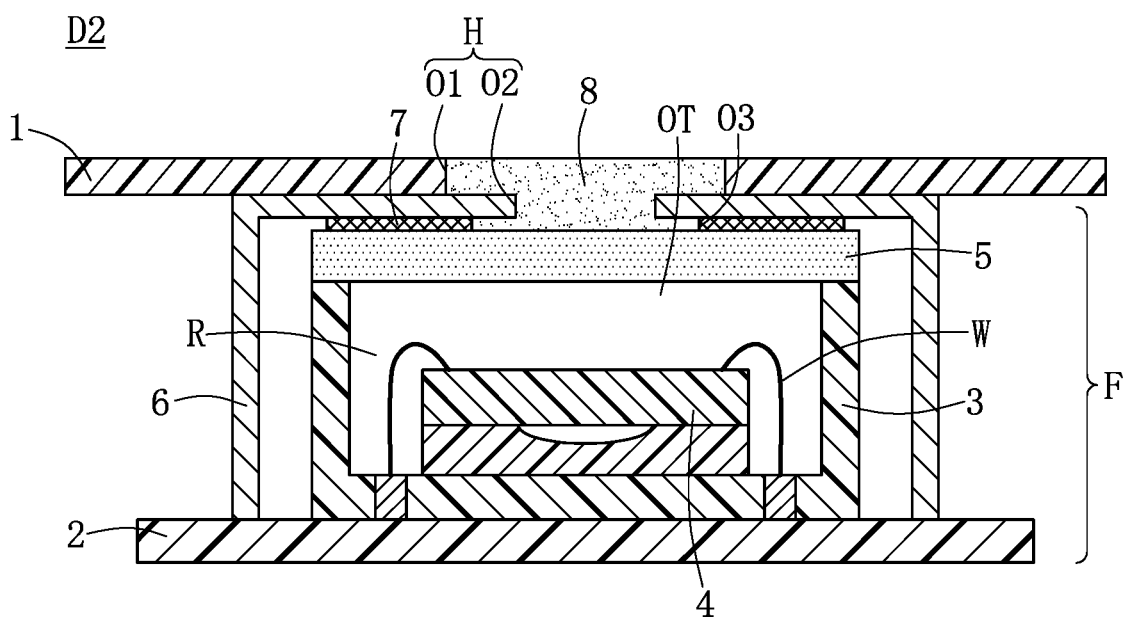
FIG. 2 shows a schematic view of a wearable device of a second embodiment in the instant disclosure.

Please refer to FIG. 2. FIG. 2 shows a schematic view of a wearable device D2 of a second embodiment in the instant disclosure. The wearable device D2 of the second embodiment of this instant disclosure has a similar package structure to the wearable device D1 of the first embodiment of this instant disclosure, and the similar elements refer to the above description. The difference between the wearable device D2 of the second embodiment and the wearable device D1 of the first embodiment in this instant disclosure is that, the wearable device D2 of the second embodiment in this instant disclosure further includes an infrared passing glue 8 which is used to fill the through hole H and the third opening O3, and is used to filter out the non-infrared light.

In the second embodiment of this instant disclosure, the through hole H formed by the first opening O1 of the case 1, the second opening O2 of the metal shielding structure 6, and the third opening O3 of the waterproof structure 7 are filled by the infrared passing glue 8 and enclosed, preventing the particles from water vapor and air entering into the wearable device D2 causing corrosion and abrasion, so as to lengthen the lifetime of the product. When the user wears the wearable device D2 of this instant disclosure (e.g., smartwatch), the thermal radiation generated from the body that is far infrared can pass through the infrared passing glue 8 to enter into the far infrared temperature sensing device F of the wearable device D2. The infrared passing glue 8 can filter out the non-infrared light, and the filter structure 5 further filters out the residual non-infrared light and only allows the far infrared to pass through and enter into the accommodating space R of the assembly structure 3, and the sensor chip 4 receives the far infrared to further conduct the temperature detection.

Third Embodiment

Figure 3:
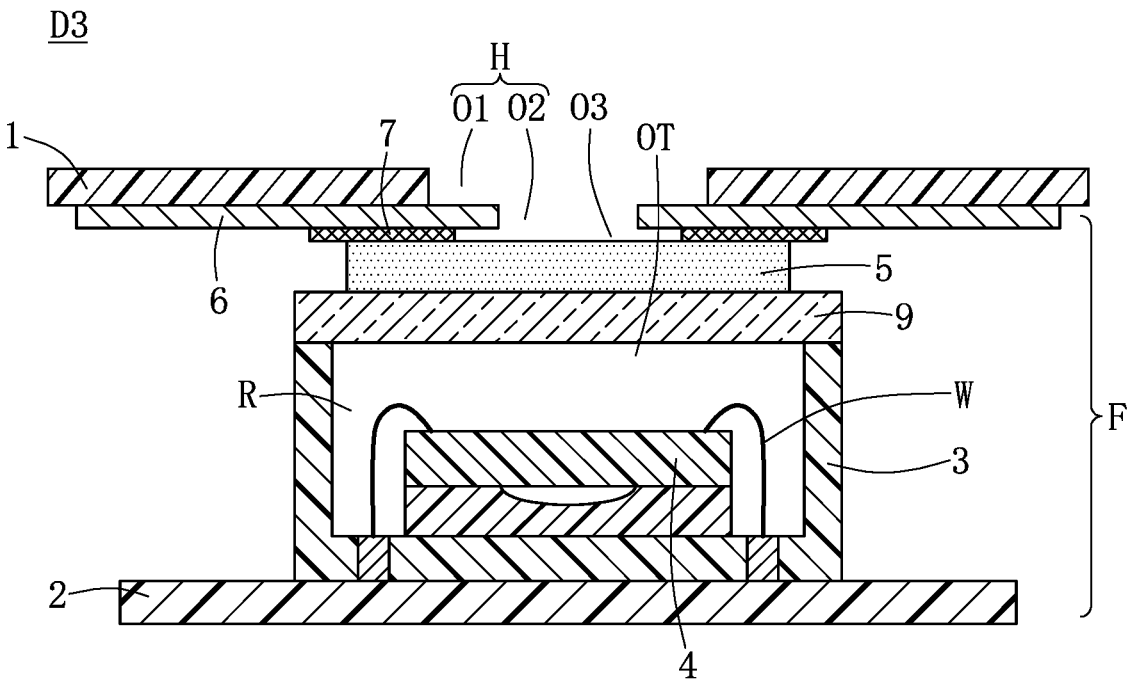
FIG. 3 shows a schematic view of a wearable device of a third embodiment in the instant disclosure.

Please refer to FIG. 3. FIG. 3 shows a schematic view of a wearable device D3 of a third embodiment in the instant disclosure. The wearable device D3 of the third embodiment of this instant disclosure has similar package structure with the wearable device D1 of the first embodiment of this instant disclosure, and for similar elements refer to the above description, identical numerals are used throughout the specification and figures that represent identical structure have identical application, function, and are selected from identical materials.

The difference between the wearable device D3 of the third embodiment and the wearable device D1 of the first embodiment in this instant disclosure is that, the wearable device D3 of the third embodiment in this instant disclosure further includes an infrared passing structure 9 which is disposed at the top opening OT of the assembly structure 3 to enclose the accommodating space R of the assembly structure 3, and the filter structure 5 is disposed between the infrared passing structure 9 and the waterproof structure 7. In order to allow the far infrared passing through the infrared passing structure 9, the material of the infrared passing structure 9 must be a transparent material which is the same as the infrared passing glue 8 of the second embodiment in this instant disclosure, that is selected from the group consisting of polyethylene (PE), polypropylene/polypropene (PP), or polyethylene terephthalate (PET), and other material which can allow the far infrared to pass through, and the infrared passing structure 9 is mainly used to filter out the non-infrared light.

In the third embodiment of this instant disclosure, the through hole H formed by the first opening O1 of the case 1 and the second opening O2 of the metal shielding structure 6, and the third opening O3 of the waterproof structure 7 can allow the far infrared to pass through, when the user wears the wearable device D3 of this instant disclosure (e.g., smartwatch), the thermal radiation generated from the body that is in the far infrared spectrum which can pass through the through hole H to enter into the far infrared temperature sensing device F of the wearable device D3. The filter structure 5 can filter out the visible light and allow the far infrared, the far infrared passes through the infrared passing structure 9 which further filters out the residual non-infrared light, the far infrared then enters into the accommodating space R of the assembly structure 3, and the sensor chip 4 receives the far infrared to further conduct the temperature detection.

Fourth Embodiment

Figure 4:
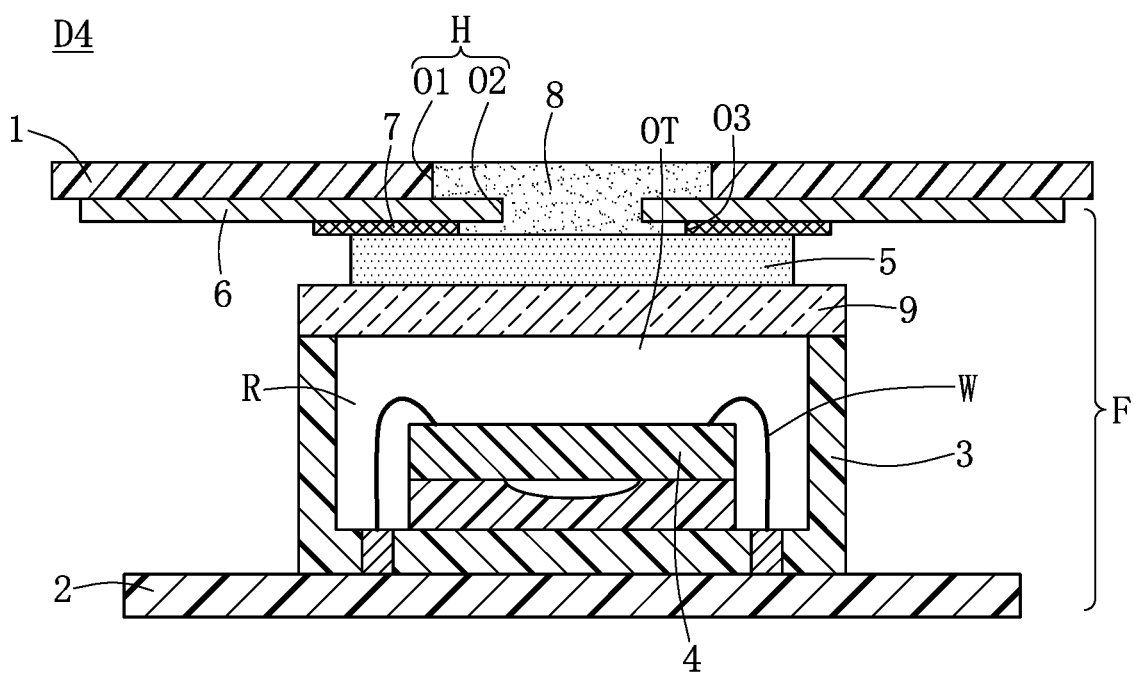
FIG. 4 shows a schematic view of a wearable device of a fourth embodiment in the instant disclosure.

Please refer to FIG. 4. FIG. 4 shows a schematic view of a wearable device D4 of a fourth embodiment in the instant disclosure. The wearable device D4 of the fourth embodiment of this instant disclosure has similar package structure with the wearable device D3 of the third embodiment of this instant disclosure.

The difference between the wearable device D4 of the fourth embodiment and the wearable device D3 of the third embodiment in this instant disclosure is that, the wearable device D4 of the fourth embodiment in this instant disclosure further includes an infrared passing glue 8 which is used to fill the through hole H and the third opening O3 to enclose the through hole H and the third opening O3.

In the fourth embodiment of this instant disclosure, the through hole H formed by the first opening O1 of the case 1 and the second opening O2 of the metal shielding structure 6, and the third opening O3 of the waterproof structure 7 are filled by the infrared passing glue 8 and enclosed, and prevent water vapor and air entering into the wearable device D4 causing corrosion and abrasion, so as to lengthen the lifetime of the product. When the user wears the wearable device D4 of this instant disclosure (e.g., smartwatch), the thermal radiation generated from the body that is far infrared can pass through the infrared passing glue 8 to enter into the far infrared temperature sensing device F of the wearable device D4. The infrared passing glue 8 can filter out the non-infrared light, the filter structure 5 further filters out other visible light and allows the far infrared, the far infrared then passes through the infrared passing structure 9 and enters into the accommodating space R of the assembly structure 3, and the sensor chip 4 receives the far infrared to further conduct the temperature detection.

Fifth Embodiment

Figure 5:
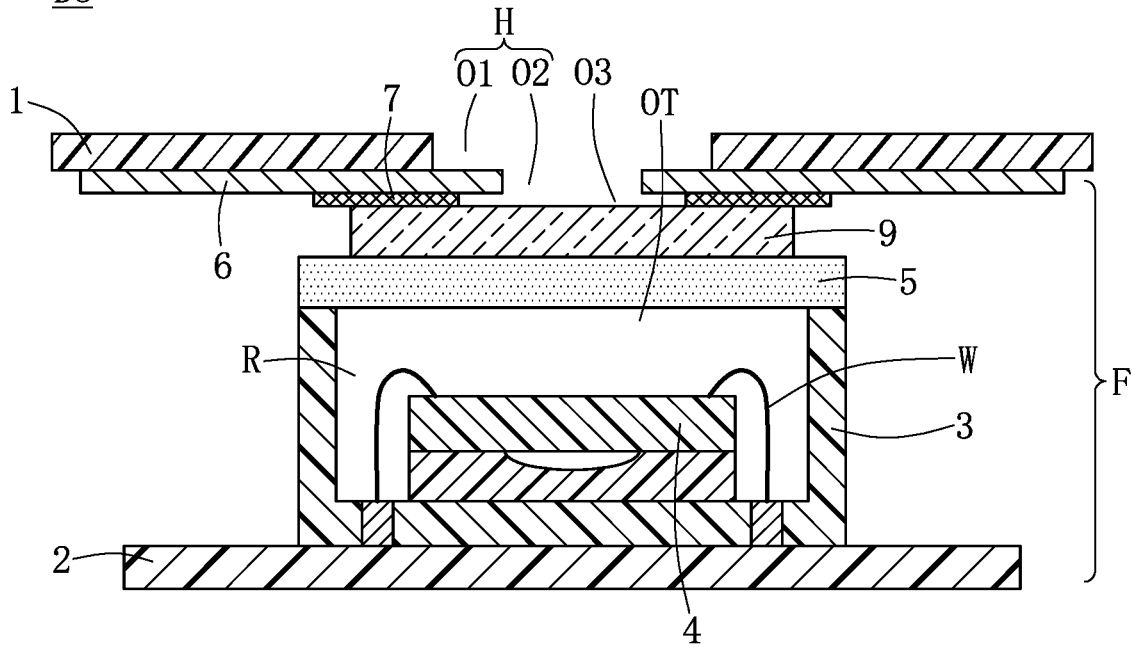
FIG. 5 shows a schematic view of a wearable device of a fifth embodiment in the instant disclosure.

Please refer to FIG. 5. FIG. 5 shows a schematic view of a wearable device D5 of a fifth embodiment in the instant disclosure. The wearable device D5 of the fifth embodiment of this instant disclosure has a similar package structure with the wearable device D3 of the third embodiment of this instant disclosure.

The difference between the wearable device D5 of the fifth embodiment and the wearable device D3 of the third embodiment in this instant disclosure is that, the infrared passing structure 9 of the wearable device D5 of the fifth embodiment in this instant disclosure is disposed between the filter structure 5 and the waterproof structure 7, and the filter structure 5 is disposed at the top opening OT of the assembly structure 3 to enclose the accommodating space R of the assembly structure 3. Similarly, in order to allow the far infrared to pass through the infrared passing structure 9, the material of the infrared passing structure 9 also must be a transparent material, and the material is the same as the infrared passing structure 9 of the third embodiment in this instant disclosure.

In the fifth embodiment of this instant disclosure, the through hole H formed by the first opening O1 of the case 1 and the second opening O2 of the metal shielding structure 6, and the third opening O3 of the waterproof structure 7 can allow the far infrared to pass through, and when the user wears the wearable device D5 of this instant disclosure (e.g., smartwatch), the thermal radiation generated from the body that is the far infrared can pass through the through hole H to enter into the far infrared temperature sensing device F of the wearable device D5. First, the far infrared passes through the infrared passing structure 9 which filters the non-infrared light, the filter structure 5 then filters out the visible light, only the far infrared can pass through and enter into the accommodating space R of the assembly structure 3, and the sensor chip 4 receives the far infrared to further conduct the temperature detection.

Sixth Embodiment

Figure 6:
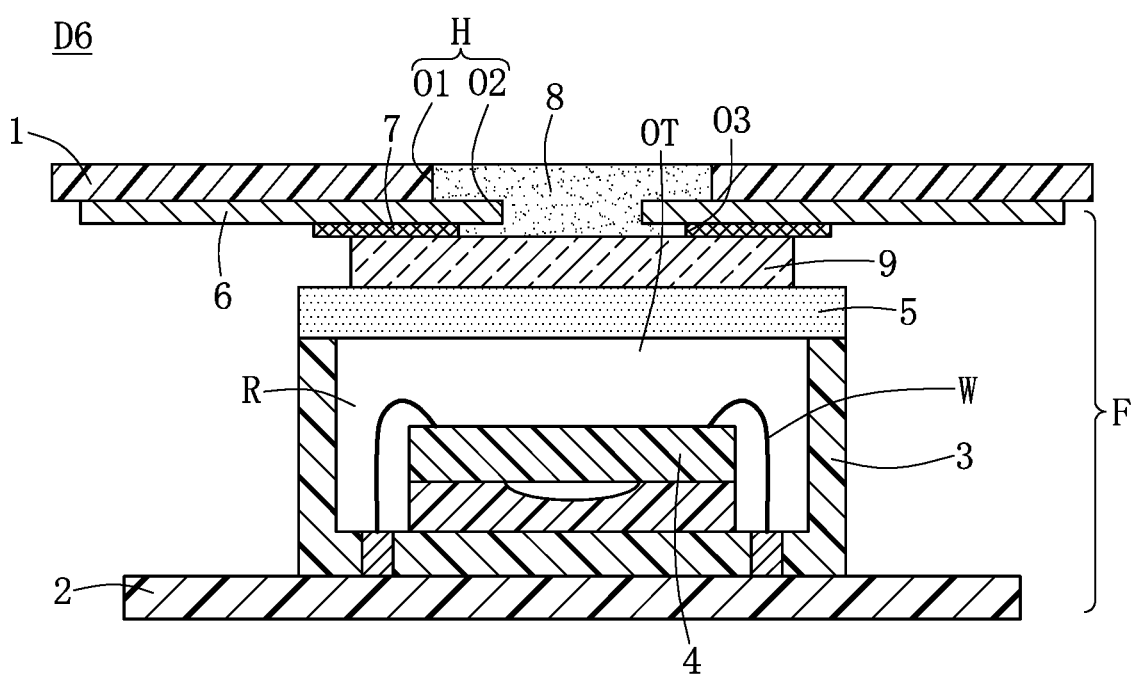
FIG. 6 shows a schematic view of a wearable device of a sixth embodiment in the instant disclosure.

Please refer to FIG. 6. FIG. 6 shows a schematic view of a wearable device D6 of a sixth embodiment in the instant disclosure. The wearable device D6 of the sixth embodiment of this instant disclosure has similar package structure with the wearable device D5 of the fifth embodiment of this instant disclosure.

The difference between the wearable device D6 of the sixth embodiment and the wearable device D5 of the fifth embodiment in this instant disclosure is that, the wearable device D6 of sixth embodiment in this instant disclosure further includes an infrared passing glue 8 which is used to fill the through hole H and the third opening O3 to enclose the through hole H and the third opening O3.

In the sixth embodiment of this instant disclosure, the through hole H formed by the first opening O1 of the case 1 and the second opening O2 of the metal shielding structure 6, and the third opening O3 of the waterproof structure 7 are filled by the infrared passing glue 8 and enclosed, and it can further enhance the product to prevent water vapor and air entering into the wearable device D6 causing corrosion and abrasion, so as to lengthen the lifetime of the product. When the user wears the wearable device D6 of this instant disclosure (e.g., smartwatch), the thermal radiation generated from the body that is the far infrared can pass through the infrared passing glue 8 to enter into the far infrared temperature sensing device F of the wearable device D6. The far infrared passes through the infrared passing structure 9 first, the infrared passing structure 9 filters out the non-infrared light, the filter structure 5 further filters out other visible light and allows the far infrared, only the far infrared can pass through and enter into the accommodating space R of the assembly structure 3, and the sensor chip 4 receives the far infrared to further conduct the temperature detection.

Seventh Embodiment

Figure 7:
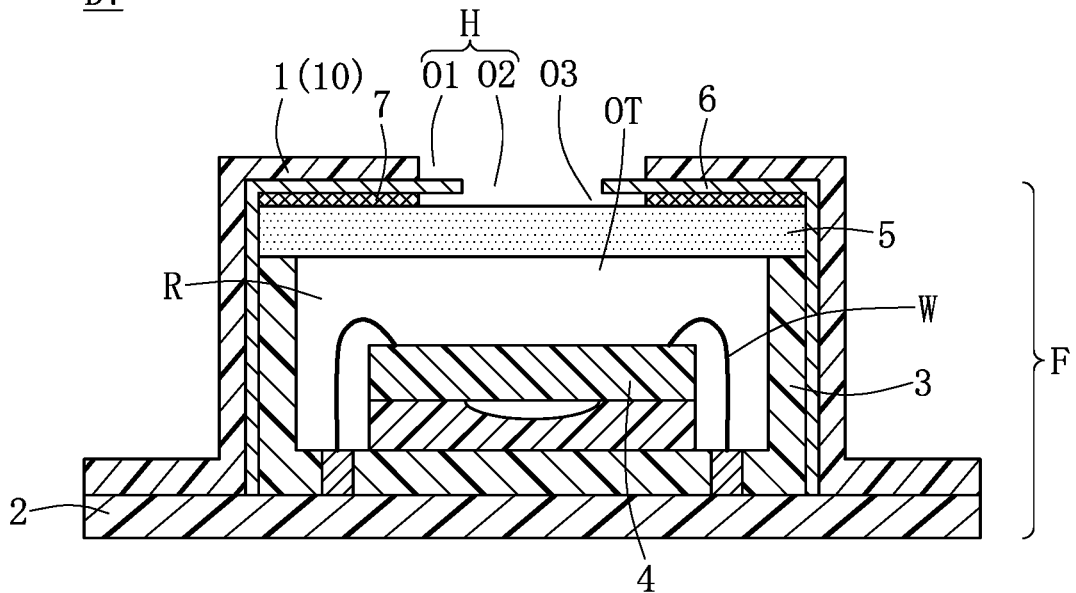
FIG. 7 shows a schematic view of a wearable device of a seventh embodiment in the instant disclosure.

Please refer to FIG. 7. FIG. 7 shows a schematic view of a wearable device D7 of a seventh embodiment in the instant disclosure. The wearable device D7 of the seventh embodiment of this instant disclosure has similar package structure with the wearable device D1 of the first embodiment of this instant disclosure.

The difference between the wearable device D7 of the seventh embodiment and the wearable device D1 of the first embodiment in this instant disclosure is that, the case 1 of the wearable device D7 of the seventh embodiment in this instant disclosure can be an isolation structure 10 which covers the metal shielding structure 6 to prevent water vapor and particles in the air entering into the wearable device D7 causing corrosion and abrasion, so as to lengthen the lifetime of the product. The material of the isolation structure 10 is selected from the group consisting of silica gel, PU, epoxy resin, and other material which can be used to prevent water from entering.

In the seventh embodiment of this instant disclosure, the isolation structure 10 has an opening, that is the first opening O1 of the case 1, and the far infrared passes through this opening. When the user wears the wearable device D7 of this instant disclosure (e.g., smartwatch), the thermal radiation generated from the body that is far infrared can pass through the opening (first opening O1) of isolation structure 10 to enter into the far infrared temperature sensing device F of the wearable device D7. The filter structure 5 filters out other visible light and allows the far infrared, the far infrared passes through the filter structure 5 to enter into the accommodating space R of the assembly structure 3, and the sensor chip 4 receives the far infrared to further conduct the temperature detection.

Eighth Embodiment

Figure 8:
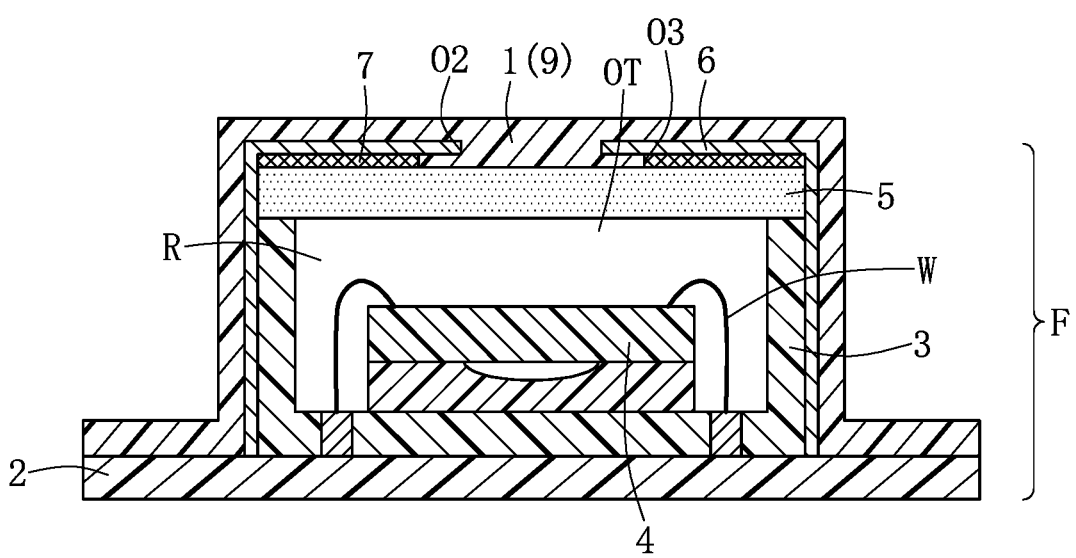
FIG. 8 shows a schematic view of a wearable device of an eighth embodiment in the instant disclosure.

Please refer to FIG. 8. FIG. 8 shows a schematic view of a wearable device D8 of an eighth embodiment in the instant disclosure. The wearable device D8 of the eighth embodiment of this instant disclosure has similar package structure to the wearable device D1 of the first embodiment of this instant disclosure.

The difference between the wearable device D8 of the eighth embodiment and the wearable device D1 of the first embodiment in this instant disclosure is that, the case 1 of the wearable device D8 of the eighth embodiment in this instant disclosure can be an infrared passing structure 9 which completely covers the metal shielding structure 6. In the eighth embodiment in this instant disclosure, the case 1 has no opening, hence there is no the first opening O1, and the second opening O2 of the metal shielding structure 6 and the third opening O3 of the waterproof structure 7 are also covered by the infrared passing structure 9, so as to enhance the waterproofing and the dust prevention effect. By disposing the means of the infrared passing structure 9 in the eighth embodiment, particles in the water vapor and the air can be prevented from entering into the wearable device D8 causing corrosion and abrasion by these particles, so as to lengthen the lifetime of the product.

In the eighth embodiment of this instant disclosure, when the user wears the wearable device D8 of this instant disclosure (e.g., smartwatch), the thermal radiation generated from the body that is the far infrared can pass through the infrared passing structure 9 to enter into the far infrared temperature sensing device F of the wearable device D8. The infrared passing structure 9 can filter out the non-infrared light first, the filter structure 5 further filters out other visible light and allows the far infrared, only the far infrared passes though the filter structure 5 and enters into the accommodating space R of the assembly structure 3, and the sensor chip 4 receives the far infrared to further conduct the temperature detection.

Ninth Embodiment

Figure 9:
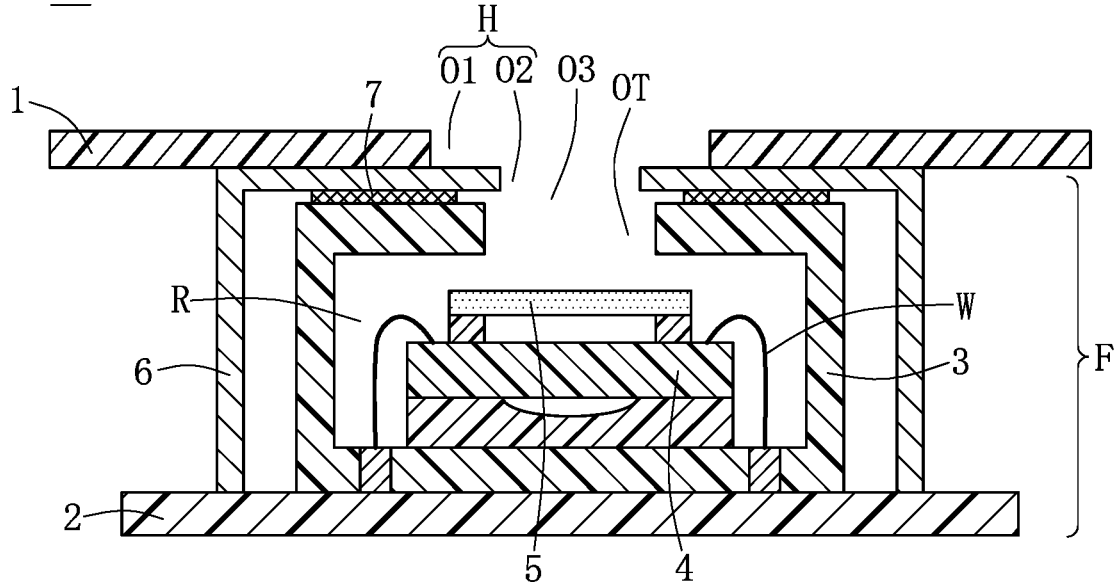
FIG. 9 shows a schematic view of a wearable device of a ninth embodiment in the instant disclosure.

Please refer to FIG. 9. FIG. 9 shows a schematic view of a wearable device D9 of a ninth embodiment in the instant disclosure. The wearable device D9 of the ninth embodiment of this instant disclosure has similar package structure with the wearable device D1 of the first embodiment of this instant disclosure.

The difference between the wearable device D9 of the ninth embodiment and the wearable device D1 of the first embodiment in this instant disclosure is that, the filter structure 5 of the wearable device D9 of the eighth embodiment in this instant disclosure is disposed inside the accommodating space R of the assembly structure 3, and the top opening OT of the assembly structure 3, the through hole H, and the third opening O3 are communicated with each other.

In the ninth embodiment of this instant disclosure, the through hole H formed by the first opening O1 of the case 1 and the second opening O2 of the metal shielding structure 6, the third opening O3 of the waterproof structure 7, and the communicated top opening OT of the assembly structure 3 can cooperatively allow the far infrared to pass through. When the user wears the wearable device D9 of this instant disclosure (e.g., smartwatch), the thermal radiation generated from the body that is the far infrared can pass through the through hole H and the top opening OT of the assembly structure 3 and directly enter into the accommodating space R of the assembly structure 3 of the far infrared temperature sensing device F of the wearable device D9. The filter structure 5 filters out other visible light and allows the far infrared to pass through, the sensor chip 4 receives the far infrared which has passed through the filter structure 5, and the temperature detection is conducted.

Tenth Embodiment

Figure 10:
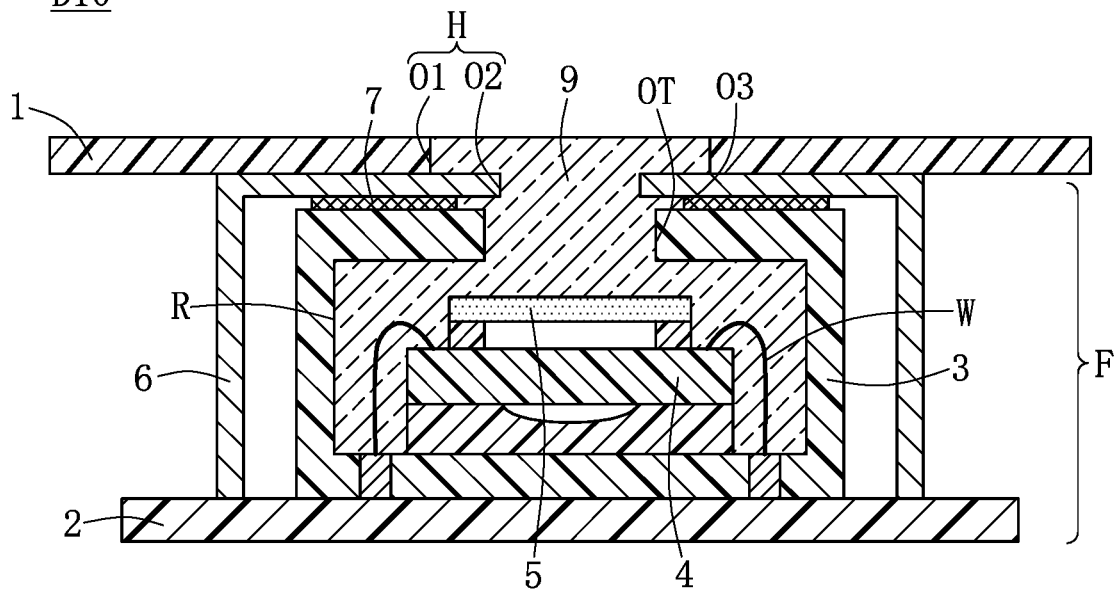
FIG. 10 shows a schematic view of a wearable device of a tenth embodiment in the instant disclosure.

Please refer to FIG. 10. FIG. 10 shows a schematic view of a wearable device D10 of a tenth embodiment in the instant disclosure. The wearable device D10 of the tenth embodiment of this instant disclosure has a similar package structure with the wearable device D9 of the ninth embodiment of this instant disclosure.

The difference between the wearable device D10 of the tenth embodiment and the wearable device D9 of the ninth embodiment in this instant disclosure is that, the wearable device D10 of the tenth embodiment in this instant disclosure further includes an infrared passing structure 9 which is disposed inside the accommodating space R of the assembly structure 3 to completely cover the sensor chip 4 and the filter structure 5, and to enclose the through hole H, the third opening O3, and the top opening OT of the assembly structure 3. The disposing means of the infrared passing structure 9 in the tenth embodiment can enhance the product to prevent water and particles in the air from entering into the wearable device D10 of this instant disclosure to avoid causing corrosion and abrasion, so as to lengthen the lifetime of the product.

In the tenth embodiment of this instant disclosure, when the user wears the wearable device D10 of this instant disclosure (e.g., smartwatch), the thermal radiation generated from the body that is the far infrared can pass through the infrared passing structure 9 to enter into the far infrared temperature sensing device F of the wearable device D10. The infrared passing structure 9 can filter out the non-infrared light first, the filter structure 5 further filters out other visible light and allows the far infrared to pass through, the sensor chip 4 receives the far infrared which has passed through the filter structure 5, and the temperature detection is conducted.

Eleventh Embodiment

Figure 11:
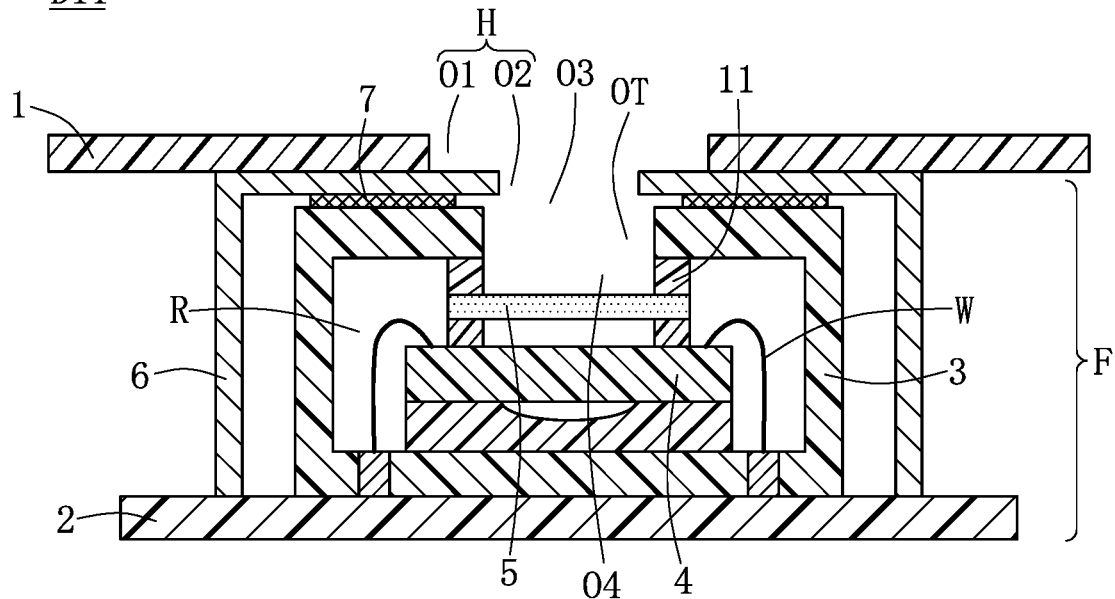
FIG. 11 shows a schematic view of a wearable device of an eleventh embodiment in the instant disclosure.

Please refer to FIG. 11. FIG. 11 shows a schematic view of a wearable device D11 of an eleventh embodiment in the instant disclosure. The wearable device D11 of the eleventh embodiment of this instant disclosure has similar package structure with the wearable device D9 of the ninth embodiment of this instant disclosure.

The difference between the wearable device D11 of the eleventh embodiment and the wearable device D9 of the ninth embodiment in this instant disclosure is that, the wearable device D11 of the eleventh embodiment in this instant disclosure further includes a waterproof layer 11 which is surroundingly disposed below the top opening OT of the assembly structure 3 and located above the filter structure 5. The waterproof layer 11 has a fourth opening O4 to expose the filter structure 5, and the fourth opening O4, the through hole H, and the third opening O3 are communicated with each other. The disposing means of the waterproof layer 11 in the eleventh embodiment can enhance the waterproof effect of the wearable device D11 of this instant disclosure. The material of the waterproof layer 11 is selected from the group consisting of silica gel, PU, epoxy resin, and other material which can be used to prevent water.

In the eleventh embodiment of this instant disclosure, the through hole H formed by the first opening O1 of the case 1 and the second opening O2 of the metal shielding structure 6, the third opening O3 of the waterproof structure 7, and the communicated fourth opening O4 of the waterproof layer 11 can cooperatively allow the far infrared to pass through. When the user wears the wearable device D11 of this instant disclosure (e.g., smartwatch), the thermal radiation generated from the body that is the far infrared can pass through the through hole H, the third opening O3, and the fourth opening O4 of the waterproof layer 11, and directly pass through the filter structure 5. The filter structure 5 filters out other visible light and allows the far infrared, and the sensor chip 4 receives the far infrared to further conduct the temperature detection.

Twelfth Embodiment

Figure 12:
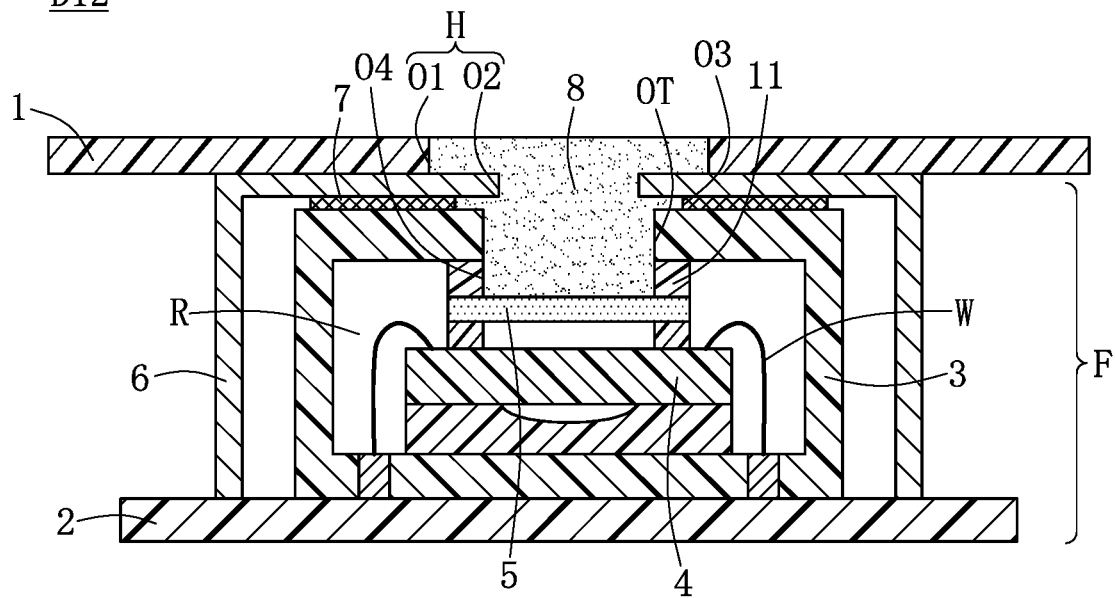
FIG. 12 shows a schematic view of a wearable device of a twelfth embodiment in the instant disclosure.

Please refer to FIG. 12. FIG. 12 shows a schematic view of a wearable device D12 of a twelfth embodiment in the instant disclosure. The wearable device D12 of the twelfth embodiment of this instant disclosure has a similar package structure with the wearable device D11 of the eleventh embodiment of this instant disclosure.

The difference between the wearable device D12 of the twelfth embodiment and the wearable device D11 of the eleventh embodiment in this instant disclosure is that, the wearable device D12 of the twelfth embodiment in this instant disclosure further includes an infrared passing glue 8 which is used to fill the through hole H and the third opening O3. The infrared passing glue 8 is used to fill into the through hole H, the third opening O3, and the fourth opening O4 to enclose the through hole H, the third opening O3, and the fourth opening O4.

In the twelfth embodiment of this instant disclosure, the through hole H formed by the first opening O1 of the case 1 and the second opening O2 of the metal shielding structure 6, the third opening O3 of the waterproof structure 7, and the fourth opening O4 of the waterproof layer 11 are cooperatively filled by the infrared passing glue 8 and enclosed, to prevent water vapor and air particles from entering into the wearable device D12 causing corrosion and abrasion, so as to lengthen the lifetime of the product. When the user wears the wearable device D12 of this instant disclosure (e.g., smartwatch), the thermal radiation generated from the body that is the far infrared can pass through the infrared passing glue 8 to enter into the far infrared temperature sensing device F of the wearable device D12. The infrared passing glue 8 can filter out the non-infrared light, the filter structure 5 further filters out other visible light and only allows the far infrared to pass through, and the sensor chip 4 receives the far infrared which has passed through the filter structure 5 to further conduct the temperature detection.

Thirteenth Embodiment

Figure 13:
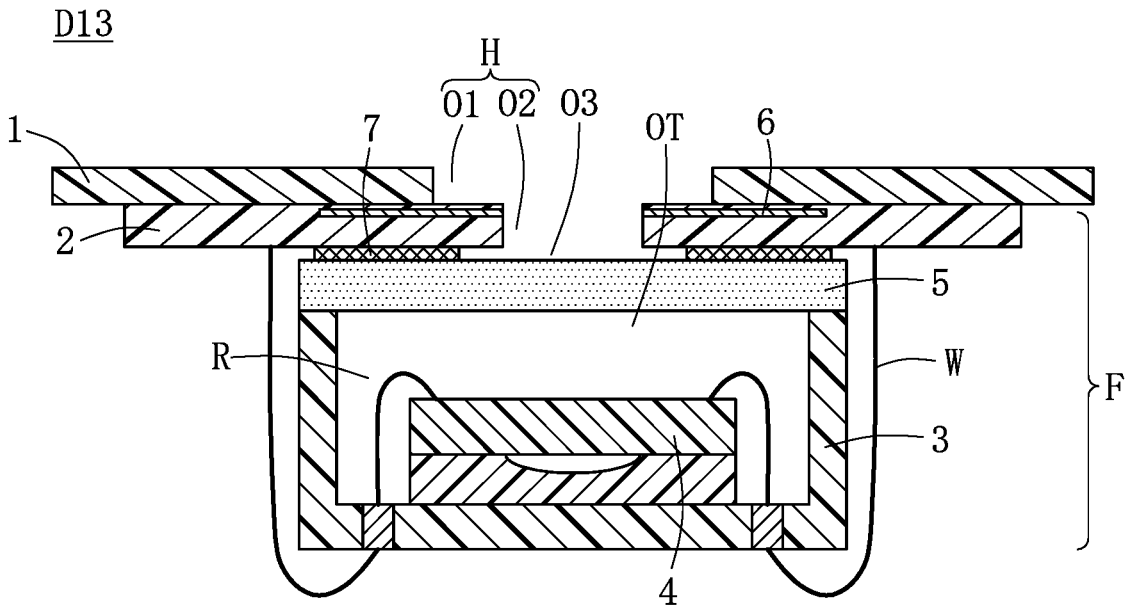
FIG. 13 shows a schematic view of a wearable device of a thirteenth embodiment in the instant disclosure.

Please refer to FIG. 13. FIG. 13 shows a schematic view of a wearable device D13 of a thirteenth embodiment in the instant disclosure. The thirteenth embodiment of this instant disclosure provides a wearable device D13 which includes a case 1 and a far infrared temperature sensing device F. The case 1 has a first opening O1. The far infrared temperature sensing device F is disposed inside the case 1 of the wearable device D13, and includes a circuit substrate 2, an assembly structure 3, a sensor chip 4, a filter structure 5, and a waterproof structure 7. The circuit substrate 2 is disposed in the case 1, contains a metal shielding structure 6, and has a second opening O2. The assembly structure 3 is disposed below the circuit substrate 2, and has an accommodating space R and a top opening OT. The sensor chip 4 is disposed in the accommodating space R of the assembly structure 3. The circuit substrate 2, the assembly structure 3, and the sensor chip 4 are electrically connected to each other by at least one wire W. The filter structure 5 is disposed at the top opening OT of the assembly structure 3 and located above the sensor chip 4 to enclose the accommodating space R of the assembly structure 3. The waterproof structure 7 is surroundingly disposed between the circuit substrate 2 and the filter structure 5, and the waterproof structure 7 has a third opening O3 to expose the filter structure 5. The first opening O1 and the second opening O2 are communicated to cooperatively define a through hole H, and the third opening O3 and the through hole H are communicated with each other.

Specifically, the case 1 can be a watch case of a smartwatch. The circuit substrate 2 can be a PCB. The metal shielding structure 6 disposed in the circuit substrate 2 is in addition used to block the noise generated from other sensors and external electronic products, and it further can prevent other far infrared from passing into the case 1 of the wearable device D13 to affect the sensing results of the sensor chip 4 and to avoid the noise interfering with the far infrared temperature sensing device F of the wearable device D13 to decrease the temperature detection accuracy when detecting the temperature. Particularly, the material of the metal shielding structure 6 is selected from the group consisting of silver, copper, aluminum, iron, and other materials which can block the noise. The assembly structure 3 can be a SMD substrate or a CLCC substrate. The sensor chip 4 is a far infrared sensor chip, and the CMOS MEMS process can be used in the sensor chip 4.

In particular, the sensor chip 4 is mainly used to detect the far infrared which has a wavelength ranging from 15 to 1000 μm. Since the living organism feels heat approximately in this wave band at room temperature, the sensor chip 4 is used to detect the temperature of the thermal radiation generated from the far infrared in this embodiment.

Moreover, the filter structure 5 can be a far infrared filter which can allow the far infrared to pass through. Additionally, the waterproof structure 7 can be a waterproof glue or a waterproof layer that can prevent moisture from entering into the wearable device D13 of this instant disclosure to cause corrosion and rusting of the element, and also can prevent the particles in the air from entering into the wearable device D13 to avoid abrasion, so as to lengthen the lifetime of the product. The material of the waterproof structure 7 is selected from the group consisting of silica gel, PU, and epoxy resin.

In the thirteenth embodiment of this instant disclosure, the case 1 has the first opening O1, the circuit substrate 2 has the second opening O2, the waterproof structure 7 has the third opening O3, the main reason being that, when the user wears the wearable device D13 of this instant disclosure (e.g., smartwatch), the thermal radiation generated from the body that is the far infrared can pass through these openings (through hole H and third opening O3) to enter into the filter structure 5. The filter structure 5 can filter out other visible light and only allow the far infrared to pass through the filter structure 5 and enter into the accommodating space R of the assembly structure 3, and the sensor chip 4 receives the far infrared to further conduct the temperature detection.

The difference between this embodiment and the above-mentioned embodiments is, in the thirteenth embodiment of this instant disclosure, the circuit substrate 2 is reversely disposed below the case 1 of the wearable device D13, since the circuit substrate 2 has a metal structure which can be directly used as the metal shielding structure 6, and it is not necessary to dispose one more metal shielding structure 6.

By this design of the thirteenth embodiment of this instant disclosure can reduce the manufacturing cost.

Fourteenth Embodiment

Figure 14:
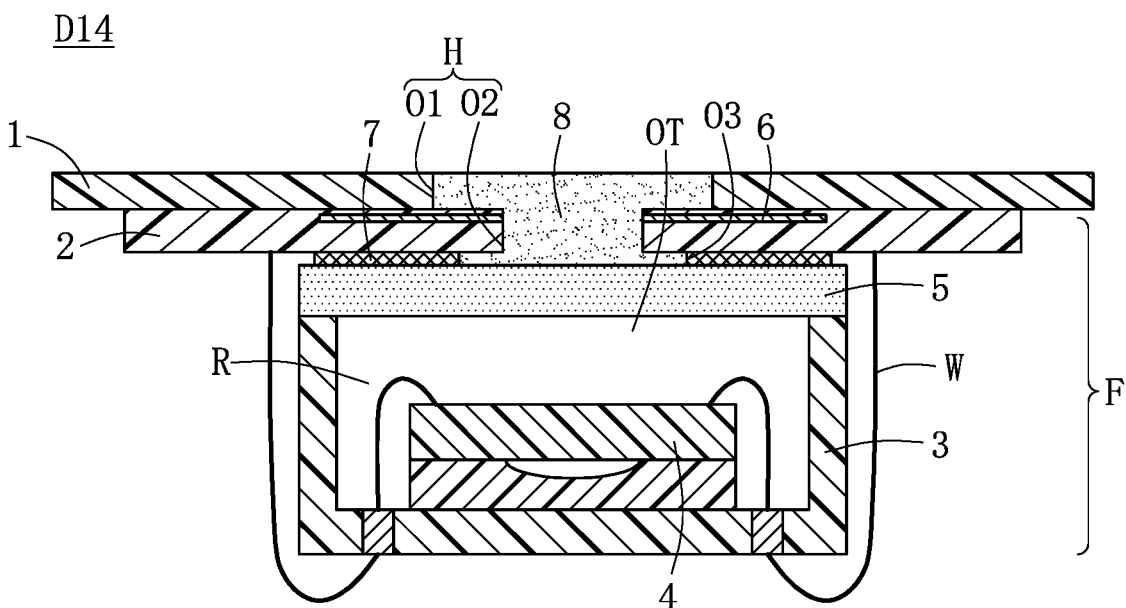
FIG. 14 shows a schematic view of a wearable device of a fourteenth embodiment in the instant disclosure.

Please refer to FIG. 14. FIG. 14 shows a schematic view of a wearable device D14 of a fourteenth embodiment in the instant disclosure. The wearable device D14 of the fourteenth embodiment of this instant disclosure has a similar package structure with the wearable device D13 of the thirteenth embodiment of this instant disclosure.

The difference between the wearable device D14 of the fourteenth embodiment and the wearable device D13 of the thirteenth embodiment in this instant disclosure is that, the wearable device D14 of the fourteenth embodiment further includes an infrared passing glue 8 which is used to fill the through hole H and the third opening O3. The infrared passing glue 8 is used to fill into the through hole H and the third opening O3 to enclose the through hole H and the third opening O3, and is mainly used to filter out the non-infrared light. The material of the infrared passing glue 8 is the same as the abovementioned embodiments.

In the fourteenth embodiment of this instant disclosure, the through hole H formed by the first opening O1 of the case 1 and the second opening O2 of the metal shielding structure 6, and the third opening O3 of the waterproof structure 7 are filled by the infrared passing glue 8 and enclosed, to prevent water vapor and air particles entering into the wearable device D14 causing corrosion and abrasion, so as to lengthen the lifetime of the product. When the user wears the wearable device D14 of this instant disclosure (e.g., smartwatch), the thermal radiation generated from the body that is the far infrared can pass through the filter structure 5 via the infrared passing glue 8. The infrared passing glue 8 can filter out the non-infrared light, the filter structure 5 further filters out other visible light and only allows the far infrared to pass through and enter into the accommodating space R of the assembly structure 3, and the sensor chip 4 receives the far infrared to further conduct the temperature detection.

Fifteenth Embodiment

Figure 15:
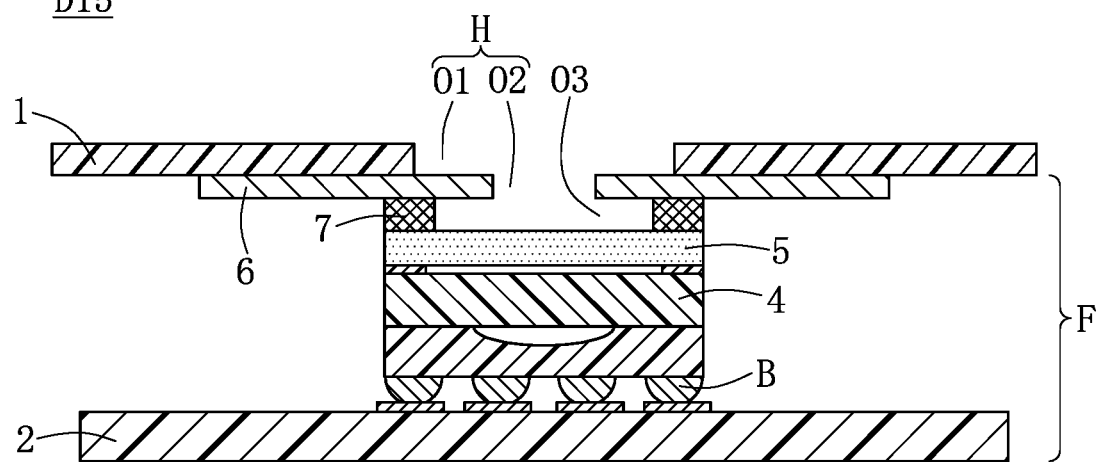
FIG. 15 shows a schematic view of a wearable device of a fifteenth embodiment in the instant disclosure.

Please refer to FIG. 15. FIG. 15 shows a schematic view of a wearable device D15 of a fifteenth embodiment in the instant disclosure. The fifteenth embodiment of this instant disclosure provides a wearable device D15 which includes a case 1 and a far infrared temperature sensing device F. The case 1 has a first opening O1. The far infrared temperature sensing device F is disposed inside the case 1 of the wearable device D15, and includes a circuit substrate 2, a sensor chip 4, a filter structure 5, a metal shielding structure 6, and a waterproof structure 7. The circuit substrate 2 is disposed in the case 1. The sensor chip 4 is disposed on the circuit substrate 2, and electrically connected to the circuit substrate 2 by at least one solder B (flip-chip bonding). The filter structure 5 is disposed on the sensor chip 4. The metal shielding structure 6 is disposed in the case 1 and located above the filter structure 5, and has a second opening O2 to expose the filter structure 5. The waterproof structure 7 is surroundingly disposed in the metal shielding structure 6 and between the metal shielding structure 6 and the filter structure 5, and has a third opening O3 to expose the filter structure 5. The first opening O1 and the second opening O2 are communicated to cooperatively define a through hole H, and the third opening O3 and the through hole H are communicated with each other.

Specifically, the case 1 can be a watch case of a smartwatch. The circuit substrate 2 can be a PCB. The sensor chip 4 is a far infrared sensor chip, and the CMOS MEMS process can be used in the sensor chip 4.

In particular, the sensor chip 4 is mainly used to detect the far infrared which has a wavelength ranging from 15 to 1000 µm. Since living organisms feel the heat approximately in this wave band at room temperature, the sensor chip 4 is used to detect the temperature of the thermal radiation generated from the far infrared.

Moreover, the filter structure 5 can be a far infrared filter which can allow the far infrared to pass through. In this embodiment, the metal shielding structure 6 in addition can be used to block the noise generated from other sensors and external electronic products, and further can prevent other far infrared from passing into the case 1 of the wearable device D15 to affect the sensing results of the sensor chip 4 and to decrease the temperature detection accuracy. Particularly, the material of the metal shielding structure 6 is selected from the group consisting of silver, copper, aluminum, iron, and other materials which can block the noise, but the material of the metal shielding structure 6 is not limited in this instant disclosure. Additionally, the waterproof structure 7 can be a waterproof glue or a waterproof layer that can prevent moisture entering into the wearable device D15 of this instant disclosure causing corrosion and rusting of the product, and also can prevent the particles in the air entering into the wearable device D15 of this instant disclosure to avoid the product suffering from abrasion by air particles, so as to lengthen the lifetime of the product. The material of the waterproof structure 7 is selected from the group consisting of silica gel, PU, and epoxy resin.

In the fifteenth embodiment of this instant disclosure, the case 1 has the first opening O1, the metal shielding structure 6 has the second opening O2, the waterproof structure 7 has the third opening O3, the main reason being that, when the user wears the wearable device D15 of this instant disclosure (e.g., smartwatch), the thermal radiation generated from the body that is far infrared can pass through these openings (through hole H and third opening O3) to enter into the far infrared temperature sensing device F of the wearable device D15. The filter structure 5 can filter out other visible light and only allow the far infrared to pass through the filter structure 5, and the sensor chip 4 receives the far infrared to further conduct the temperature detection.

Sixteenth Embodiment

Figure 16:
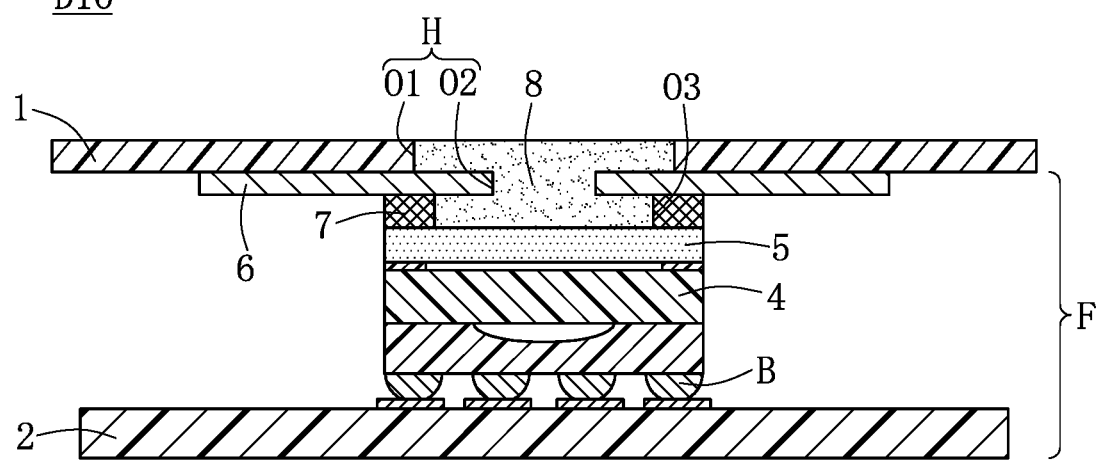
FIG. 16 shows a schematic view of a wearable device of a sixteenth embodiment in the instant disclosure.

Please refer to FIG. 16. FIG. 16 shows a schematic view of a wearable device D16 of a sixteenth embodiment in the instant disclosure. The wearable device D16 of the sixteenth embodiment of this instant disclosure has a similar package structure with the wearable device D15 of the fifteenth embodiment of this instant disclosure.

The difference between the wearable device D16 of the sixteenth embodiment and the wearable device D15 of the fifteenth embodiment in this instant disclosure is that, the wearable device D16 of the sixteenth embodiment further includes an infrared passing glue 8 which is used to fill the through hole H and the third opening O3. The infrared passing glue 8 is used to fill into the through hole H and the third opening O3 to enclose the through hole H and the third opening O3.

In the sixteenth embodiment of this instant disclosure, the through hole H formed by the first opening O1 of the case 1 and the second opening O2 of the metal shielding structure 6, and the third opening O3 of the waterproof structure 7 are filled by the infrared passing glue 8 and enclosed. This can further enhance the product to prevent water vapor and particles in the air from entering into the wearable device D16 of this instant disclosure to cause the product to suffer from corrosion and abrasion, so as to lengthen the lifetime of the product. When the user wears the wearable device D16 of this instant disclosure (e.g., smartwatch), the thermal radiation generated from the body that is far infrared can pass through the infrared passing glue 8 to enter into the far infrared temperature sensing device F of the wearable device D16. The infrared passing glue 8 can filter out the non-infrared light, the filter structure 5 further filters out other visible light and only allows the far infrared passing through the filter structure 5, and the sensor chip 4 receives the far infrared to further conduct the temperature detection.

Seventeenth Embodiment

Figure 17:
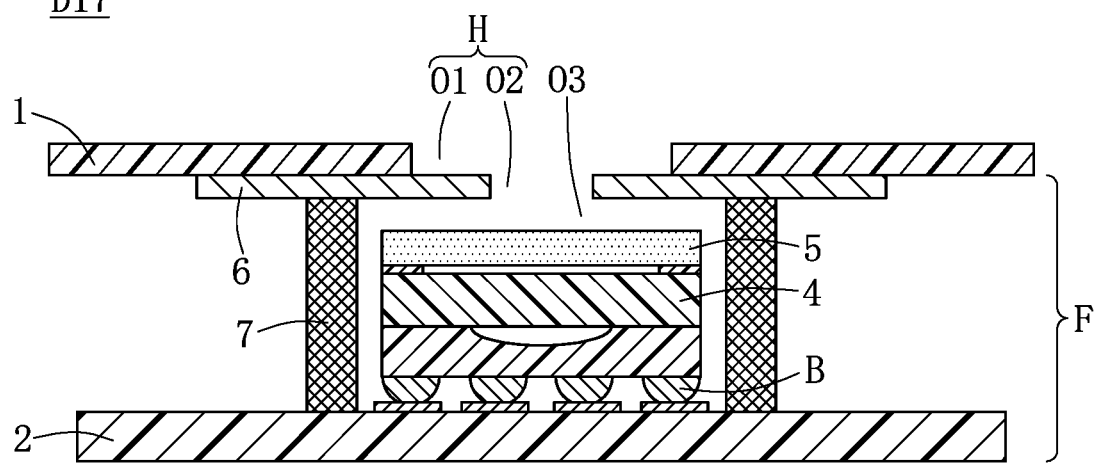
FIG. 17 shows a schematic view of a wearable device of a seventeenth embodiment in the instant disclosure.

Please refer to FIG. 17. FIG. 17 shows a schematic view of a wearable device D17 of a seventeenth embodiment in the instant disclosure. The wearable device D17 of the seventeenth embodiment of this instant disclosure has similar package structure with the wearable device D15 of the fifteenth embodiment of this instant disclosure.

The difference between the wearable device D17 of the seventeenth embodiment and the wearable device D15 of the fifteenth embodiment in this instant disclosure is that, the waterproof structure 7 of the wearable device D17 of the seventeenth embodiment is disposed between the metal shielding structure 6 and the circuit substrate 2.

In the seventeenth embodiment of this instant disclosure, when the user wears the wearable device D17 of this instant disclosure (e.g., smartwatch), the thermal radiation generated from the body that is far infrared can pass through the through hole H formed by the first opening O1 of the case 1 and the second opening O2 of the metal shielding structure 6 and the third opening O3 of the waterproof structure 7 to enter into the far infrared temperature sensing device F of the wearable device D17. The filter structure 5 can filter out other visible light and only allow the far infrared to pass through the filter structure 5, and the sensor chip 4 receives the far infrared to further conduct the temperature detection.

Eighteenth Embodiment

Figure 18:
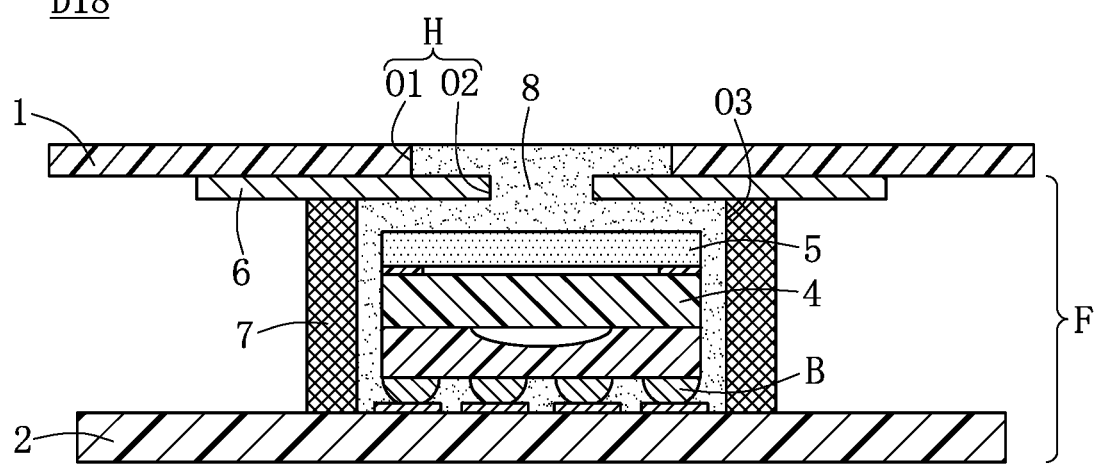
FIG. 18 shows a schematic view of a wearable device of an eighteenth embodiment in the instant disclosure.

Please refer to FIG. 18. FIG. 18 shows a schematic view of a wearable device D18 of an eighteenth embodiment in the instant disclosure. The wearable device D18 of the eighteenth embodiment of this instant disclosure has similar package structure with the wearable device D17 of the seventeenth embodiment of this instant disclosure.

The difference between the wearable device D18 of the eighteenth embodiment and the wearable device D17 of the seventeenth embodiment in this instant disclosure is that, the wearable device D18 of the eighteenth embodiment further includes an infrared passing structure 9 which is disposed on the circuit substrate 2 and located in the waterproof structure 7 to completely cover the sensor chip 4 and the filter structure 5, and to enclose the through hole H and the third opening O3. The disposing means of the infrared passing structure 9 in the eighteenth embodiment can prevent water and air particles entering into the wearable device D18 to avoid corrosion and abrasion, so as to lengthen the lifetime of the product. The material of the infrared passing structure 9 is the same as the abovementioned embodiments, and it is not repeated herein.

In the eighteenth embodiment of this instant disclosure, when the user wears the wearable device D18 of this instant disclosure (e.g., smartwatch), the thermal radiation generated from the body that is far infrared can pass through the infrared passing structure 9 to enter into the far infrared temperature sensing device F of the wearable device D18. The infrared passing structure 9 can filter out the non-infrared light, the filter structure 5 further filters out other visible light and only allows far infrared to pass through the filter structure 5, and the sensor chip 4 receives the far infrared to further conduct the temperature detection.

Nineteenth Embodiment

Figure 19:
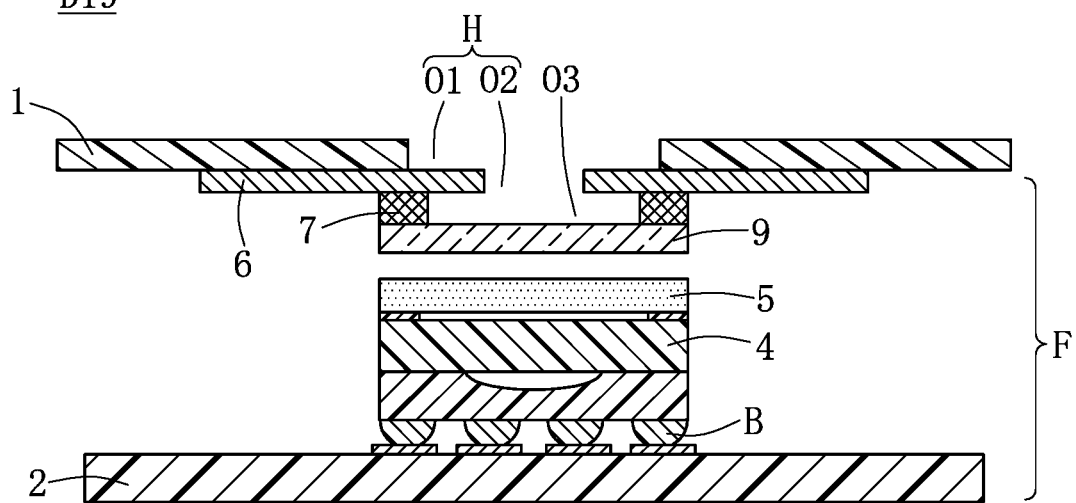
FIG. 19 shows a schematic view of a wearable device of a nineteenth embodiment in the instant disclosure.

Please refer to FIG. 19. FIG. 19 shows a schematic view of a wearable device D19 of a nineteenth embodiment in the instant disclosure. The wearable device D19 of the nineteenth embodiment of this instant disclosure has similar package structure with the wearable device D15 of the fifteenth embodiment of this instant disclosure.

The difference between the wearable device D19 of the nineteenth embodiment and the wearable device D15 of the fifteenth embodiment in this instant disclosure is that, the wearable device D19 of the nineteenth embodiment further includes an infrared passing structure 9 which is disposed between the filter structure 5 and the waterproof structure 7.

In the nineteenth embodiment of this instant disclosure, the through hole H formed by the first opening O1 of the case 1 and the second opening O2 of the metal shielding structure 6 and the third opening O3 of the waterproof structure 7 allows the far infrared to pass through. When the user wears the wearable device D19 of this instant disclosure (e.g., smartwatch), the thermal radiation generated from the body that is far infrared can pass through the through hole H to enter into the far infrared temperature sensing device F of the wearable device D19. First, the far infrared passes through the infrared passing structure 9 which filters the non-infrared light, the filter structure 5 then filters out other visible light, only the far infrared can pass through, and the sensor chip 4 receives the far infrared to further conduct the temperature detection.

Twentieth Embodiment

Figure 20:
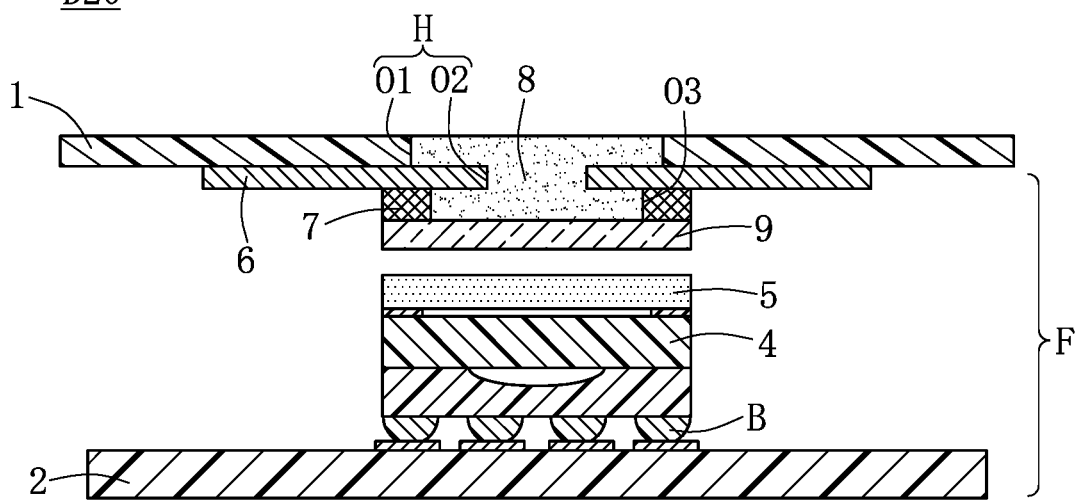
FIG. 20 shows a schematic view of a wearable device of a twentieth embodiment in the instant disclosure.

Please refer to FIG. 20. FIG. 20 shows a schematic view of a wearable device D20 of a twentieth embodiment in the instant disclosure. The wearable device D20 of the twentieth embodiment of this instant disclosure has similar package structure with the wearable device D19 of the nineteenth embodiment of this instant disclosure.

The difference between the wearable device D20 of the twentieth embodiment and the wearable device D19 of the nineteenth embodiment in this instant disclosure is that, the wearable device D20 of the twentieth embodiment further includes an infrared passing glue 8 which is used to fill and enclose the through hole H and the third opening O3.

In the twentieth embodiment of this instant disclosure, the through hole H formed by the first opening O1 of the case 1 and the second opening O2 of the metal shielding structure 6, and the third opening O3 of the waterproof structure 7 is filled by the infrared passing glue 8 and enclosed. This can further enhance the product to prevent water vapor and particles in the air entering into the wearable device D20 causing corrosion and abrasion, so as to lengthen the lifetime of the product. When the user wears the wearable device D20 of this instant disclosure (e.g., smartwatch), the thermal radiation generated from the body that is far infrared can pass through the infrared passing glue 8 to enter into the far infrared temperature sensing device F of the wearable device D20. First, the far infrared passes through the infrared passing structure 9 which filters the non-infrared light. The filter structure 5 then filters out other visible light, only the far infrared can pass through, and the sensor chip 4 receives the far infrared to further conduct the temperature detection.

Twenty First Embodiment

Figure 21:
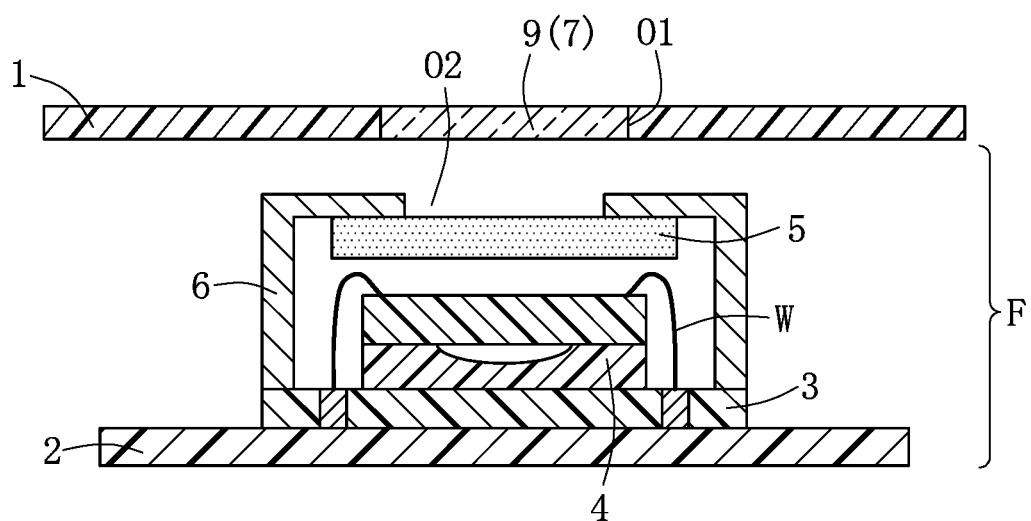
FIG. 21 shows a schematic view of a wearable device of a twenty first embodiment in the instant disclosure.

Please refer to FIG. 21. FIG. 21 shows a schematic view of a wearable device D21 of a twenty first embodiment in the instant disclosure. The twenty first embodiment of this instant disclosure provides a wearable device D21 which includes a case 1 and a far infrared temperature sensing device F. The case 1 has a first opening O1. The far infrared temperature sensing device F is disposed inside the case 1 of the wearable device D21, and includes a circuit substrate 2, an assembly structure 3, a sensor chip 4, a filter structure 5, a metal shielding structure 6, and a waterproof structure 7. The circuit substrate 2 is disposed in the case 1. The assembly structure 3 is disposed on the circuit substrate 2. The sensor chip 4 is disposed on the assembly structure 3, and is electrically connected to the assembly structure 3 by at least one wire W. The filter structure 5 is disposed above the sensor chip 4. The metal shielding structure 6 is disposed on the assembly structure 3, surrounds the sensor chip 4 and the filter structure 5, and has a second opening O2 to expose the filter structure 5. The waterproof structure 7 is disposed in the first opening O1 of the case 1 to enclose the case 1, and the waterproof structure 7 can be an infrared passing structure 9.

Specifically, in the twenty first embodiment of this instant disclosure, the case 1 can be a watch case of a smartwatch. The circuit substrate 2 can be a PCB. The assembly structure 3 can be a SMD substrate or a CLCC substrate. The sensor chip 4 is a far infrared sensor chip, and the CMOS MEMS process can be used in the sensor chip 4.

In particular, the sensor chip 4 is mainly used to detect the far infrared which has a wavelength ranging from 15 to 1000 μm. Since living organisms feel the heat approximately in this wave band at room temperature, the sensor chip 4 is used to detect the temperature of the thermal radiation generated from the far infrared.

Furthermore, the filter structure 5 can be a far infrared filter which can allow the far infrared to pass through. In this embodiment, the metal shielding structure 6 in addition can be used to block the noise generated from other sensors and external electronic products, and further can prevent other far infrared from passing into the case 1 of the wearable device D21 affecting the sensing results of the sensor chip 4 and decreasing the temperature detection accuracy. Particularly, the material of the metal shielding structure 6 is selected from the group consisting of silver, copper, aluminum, iron, and other materials which can block the noise, but the material of the metal shielding structure 6 is not limited in this instant disclosure. Additionally, the waterproof structure 7 can be a waterproof glue or a waterproof layer that can prevent moisture entering into the wearable device D21 causing corrosion and rusting, and also can prevent air particles entering into the wearable device D21 avoiding abrasion, so as to lengthen the lifetime of the product. In the twenty first embodiment of this instant disclosure, the waterproof structure 7 also acts as the infrared passing structure 9, in order to allow the far infrared to pass through the waterproof structure 7 (infrared passing structure 9). The material of the waterproof structure 7 must be a transparent material which is selected from the group consisting of PE, PP, PET, and other material that far infrared can pass through.

In the twenty first embodiment of this instant disclosure, the first opening O1 of the case 1 is enclosed by the waterproof structure 7 to further enhance the product to prevent water vapor and particles in the air from entering into the wearable device D21 to avoid corrosion and abrasion, so as to lengthen the lifetime of the wearable device D21. When the user wears the wearable device D21 of this instant disclosure (e.g., smartwatch), the thermal radiation generated from the body that is far infrared can pass through the waterproof structure 7 to enter into the far infrared temperature sensing device F of the wearable device D21. At this time, the waterproof structure 7 including the infrared passing structure 9 can filter out the non-infrared light, the filter structure 5 further filters out other visible light, and only allows the far infrared to pass through the filter structure 5 and enter into the accommodating space R of the assembly structure 3, and the sensor chip 4 receives the far infrared to further conduct the temperature detection.

Embodiments Efficacy

In summary, the benefit of the instant disclosure is that, in this instant disclosure, by the metal shielding structure surrounding the internal sensing elements (e.g., sensor chip, circuit substrate) in the far infrared temperature sensing device of the wearable device, it can block the noise generated from other sensors and external electronic products that can avoid interfering with the sensing elements, and to block other far infrared passing into the case of the wearable device that can avoid the sensing result of the sensor chip being affected, so as to increase the detection accuracy on the far infrared temperature. The metal shielding structure further has an opening, it only allows the infrared at a certain position to enter thereinto, and other parts outside the opening are blocked by the metal shielding structure and cannot enter into the wearable device. In this way, it can appear a superior Signal-to-Noise Ratio (SNR). Meanwhile, the detection accuracy on the far infrared temperature can be increased.

The descriptions illustrated supra set forth simply the preferred embodiments of the present invention; however, the characteristics of the present invention are by no means restricted thereto. All changes, alterations, or modifications conveniently considered by those skilled in the art are deemed to be encompassed within the scope of the present invention delineated by the following claims.

What is claimed is:

1. A wearable device, comprising:
   a case having a first opening; and
   a far infrared temperature sensing device disposed inside the case of the wearable device, and the far infrared temperature sensing device including:
      an assembly structure;
      a sensor chip which is disposed on the assembly structure; and
      a metal shielding structure which is disposed on the assembly structure and surrounds the sensor chip, wherein the metal shielding structure has a second opening.

2. The wearable device as claimed in claim 1, wherein the far infrared temperature sensing device further comprises:
   a circuit substrate disposed in the case; and
   a waterproof structure disposed in the first opening of the case;

wherein the waterproof structure is used to enclose the case.

3. The wearable device as claimed in claim 1, wherein the sensor chip is electrically connected to the assembly structure by at least one wire.

4. The wearable device as claimed in claim 2, wherein the waterproof structure is an infrared passing structure.

5. The wearable device as claimed in claim 1, wherein the assembly structure is disposed on the circuit substrate.

6. The wearable device as claimed in claim 1, wherein the sensor chip is configured to detect a far infrared which has a wavelength ranging from 15 to 1000 μm.

7. The wearable device as claimed in claim 1, wherein the metal shielding structure is configured to block the noise generated from other sensors and external electronic products, and prevent other far infrared from passing into the case.

8. The wearable device as claimed in claim 1, wherein the case is a watch case of a smartwatch, the assembly structure is a SMD substrate or a CLCC substrate, and the sensor chip is a far infrared sensor chip.

9. The wearable device as claimed in claim 2, wherein the circuit substrate is a PCB and the waterproof structure is a waterproof glue or a waterproof layer.

* * * * *